(12) United States Patent
Lamy et al.

(10) Patent No.: US 12,690,164 B2
(45) Date of Patent: Jul. 21, 2026

(54) HEAT SINK FOR ACTIVE COMPUTE BLADE CONNECTOR

(71) Applicants: BULL SAS, Les Clayes-sous-Bois (FR); Le Commissariat à l'énergie atomique et aux énergies alternatives (CEA), Paris (FR)

(72) Inventors: Pierre Lamy, Paris (FR); Romain Berquier, Les Clayes-sous-Bois (FR)

(73) Assignees: BULL SAS, Les Clayes sous Bois (FR); LE COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 115 days.

(21) Appl. No.: 18/469,722

(22) Filed: Sep. 19, 2023

(65) Prior Publication Data

US 2024/0107704 A1 Mar. 28, 2024

(30) Foreign Application Priority Data

Sep. 28, 2022 (EP) ..................................... 22306438

(51) Int. Cl.
| | |
|---|---|
| *H05K 7/20* | (2006.01) |
| *G02B 6/42* | (2006.01) |
| *G06F 1/20* | (2006.01) |

(52) U.S. Cl.
CPC ..... *H05K 7/20254* (2013.01); *H05K 7/20772* (2013.01); *G02B 6/4268* (2013.01); *G06F 1/20* (2013.01)

(58) Field of Classification Search
CPC .. H05K 7/20254; H05K 7/20772; G06F 1/20; G02B 6/4268

USPC ....................................................... 361/679.53
See application file for complete search history.

(56) References Cited

U.S. PATENT DOCUMENTS

| | | | | |
|---|---|---|---|---|
| 5,455,739 | A * | 10/1995 | Barden .............. | H05K 7/20409 |
| | | | | 361/796 |
| 11,112,573 | B2 * | 9/2021 | Shearman .............. | H04B 1/036 |
| 12,042,890 | B2 * | 7/2024 | Lamy ................. | H05K 7/20254 |
| 2016/0118317 | A1 * | 4/2016 | Shedd ........................ | F28F 9/26 |
| | | | | 257/712 |
| 2017/0185115 | A1 * | 6/2017 | Watanabe ................. | G06F 1/20 |
| 2021/0112683 | A1 | 4/2021 | Mohajer et al. | |
| 2021/0132311 | A1 | 5/2021 | Shearman et al. | |
| 2022/0408589 | A1 * | 12/2022 | Ji ............................ | F28D 1/035 |
| 2024/0114666 | A1 * | 4/2024 | Lamy ........................ | G06F 1/20 |

OTHER PUBLICATIONS

Search Report issued in EP22306438.7 on Mar. 9, 2023 (7 pages) and English Machine Translation thereof.

* cited by examiner

*Primary Examiner* — Anatoly Vortman
(74) *Attorney, Agent, or Firm* — ARC IP Law, PC; Joseph J. Mayo

(57) ABSTRACT

A liquid-cooled heat sink for a plurality of compute blade connectors, including an elongated shaped body defining on one of its faces a heat collection surface of the plurality of connectors. The heat collection surface includes a plurality of interfacing zones arranged consecutively along the heat collection surface, wherein each interfacing zone is configured to interface with a connector of the plurality of connectors in order to collect the heat, and wherein the heat sink includes at least one stiffener mounted on the body.

13 Claims, 4 Drawing Sheets

HEAT SINK FOR ACTIVE COMPUTE BLADE CONNECTOR

This application claims priority to European Patent Application Number 22306438.7, filed 28 Sep. 2022, the specification of which is hereby incorporated herein by reference.

BACKGROUND OF THE INVENTION

Technical Field of the Invention

At least one embodiment of the invention relates to the field of cooling of active compute blade connectors and relates more particularly to a liquid-cooled heat sink for active compute blade connector and the method of manufacturing thereof.

Description of the Related Art

In server compute blades, in particular for supercomputers, it is known to use connectors to interconnect one or more electronic boards from the compute blade to a communication network external to the compute blade.

These connectors are called "active" because they integrate active electronic components allowing signal re-amplification to allow data exchange between the compute blade and the outside while maintaining the integrity of the high speed links, for example with another compute blade or a server via a communication network.

Active connectors have a high thermal capacity, i.e. they emit a substantial amount of heat and must therefore be cooled.

Among the active connectors for compute blades, a distinction is made between connectors of the Quad Small Form-factor Pluggable (QSFP) type and connectors of the Octal Small Form Factor Pluggable (OSFP) type, which is the generation after that of QSFP connectors.

QSFP connectors have a thermal capacity of typically up to 8 W while OSFP connectors have a thermal capacity of generally up to 18 W.

As OSFP connectors have only recently been introduced to the market, existing active connector cooling solutions have been mainly developed for cooling the QSFP connector generation.

Thus, cooling solutions for active connectors are generally provided for small groups of connectors, typically four or five connectors. In addition, the electronic board(s) of the computer blade must have the necessary number of fastening points to mount the heat sink above the connector group.

By way of example, in reference to FIG. 1, the compute blade 100 comprises a first heat sink 110 for cooling a first face 115A of an electronic board 115 comprising four connectors 117 and a second heat sink 120 making it possible to cool a second face 115B of the electronic board 115, also comprising four connectors 117. The first heat sink 110 is fastened to the electronic board 115 via four fastening points 130 and has a hydraulic inlet 111 and a hydraulic outlet 112. The second heat sink 120 is fastened to the electronic board 115 via four fastening points 140 (only two of which are visible in FIG. 1) and has a hydraulic inlet and a hydraulic outlet (not visible in FIG. 1).

The existing solutions thus have several disadvantages. First of all, many fastening points on the electronic board(s) are required, which makes the manufacturing and layout of the compute blade more complex. Then, in some compute blades, assemblies of sixteen OSFP type connectors must be able to be used, which would require four heat sinks with the layouts of current solutions and would seem complex or even impossible to implement, while increasing the number of hydraulic connection pipes necessary in a way that is difficult to manage in terms of connection and space. The existing solutions also involve a lack of compactness of the compute blade, in particular due to the many pipes and fastening points required. Finally, the existing solutions are not thermally efficient enough for cooling active connectors with high thermal capacity, in particular of the OSFP type.

It would therefore be advantageous to propose a simple, reliable and effective solution that makes it possible to at least partially remedy these disadvantages.

BRIEF SUMMARY OF THE INVENTION

For this purpose, at least one embodiment of the invention has for object a liquid-cooled heat sink for a plurality of compute blade connectors, the heat sink including an elongated shaped body defining on one of its faces a heat collection surface of the plurality of connectors, the body including a refrigerant liquid inlet port and a refrigerant liquid outlet port and being configured to convey the refrigerant liquid through a cooling circuit between the inlet port and the outlet port, the heat collection surface comprising a plurality of interfacing zones arranged consecutively along the heat collection surface, each interfacing zone being configured to interface with a connector of the plurality of connectors in order to collect the heat to transfer it to the cooling circuit, the heat sink comprising at least one stiffener mounted on the body.

The at least one stiffener, in at least one embodiment, makes it possible to stiffen the body of the heat sink sufficiently to provide the body with a substantial heat collection surface. The at least one stiffener, by way of one or more embodiments, in particular makes it possible to increase the length to width ratio of the body to be able to interface with a more substantial number of active connectors while minimizing the height which is below 1 U (1 rack unit or the standardized height of electronic equipment designed to be mounted in a rack). By using an elongated body and at least one stiffener, the heat sink according to one or more embodiments of the invention makes it possible to cool more than five active connectors at the same time, in particular up to at least sixteen active connectors.

Advantageously, by way of one or more embodiments, the at least one stiffener is arranged along at least part of the interfacing zones in order to reinforce them.

Further advantageously, by way of one or more embodiments, the at least one stiffener is arranged at least along the entire length of the interfacing zones in order to further reinforce them.

Preferably, by way of one or more embodiments, the at least one stiffener is arranged at least along the entire length of the heat collection surface in order to stiffen the entire said surface.

More preferably, by way of one or more embodiments, the at least one stiffener has a U shape extending along a longitudinal edge and two lateral edges of the body in order to further stiffen said body around the heat collection surface, in particular in the two orthogonal directions of length and width of the body.

According to at least one embodiment of the invention, the at least one stiffener is made of metal, preferably of steel.

In at least one embodiment, the interfacing zones have a rectangular shape to hug parallelepiped shape connectors, in particular of the OSFP type.

Advantageously, by way of one or more embodiments, the interfacing zones are delimited by an edge of the body in order to limit the width of said body.

Preferably, by way of one or more embodiments, the heat collection surface comprises at least eight interfacing zones, preferably at least twelve interfacing zones, for example sixteen interfacing zones to interface with at least sixteen connectors arranged side by side.

In at least one embodiment, the inlet port is located at a first end of the body and the outlet port is located at a second end, opposite the first end, in order to allow the cooling circuit to pass through the body and capture heat effectively.

Preferably, by way of one or more embodiments, the body comprises a single inlet port and a single outlet port to simplify creation of the body.

According to at least one embodiment of the invention, the body has a substantially rectangular global shape in order to facilitate the arrangement of the heat sink in a compute blade.

Preferably, by way of one or more embodiments, the ratio of the length of the body over the width of the body is greater than two, preferably four, in order to be able to interface the heat sink with a substantial number of connectors, preferably at least eight connectors, for example sixteen connectors.

Preferably, by way of one or more embodiments, the body is made of metal, preferably aluminium, more preferably in series 6063 aluminium.

At least one embodiment of the invention also relates to a compute blade for a supercomputer comprising at least one electronic board comprising at least one processor, a plurality of connectors, preferably at least eight connectors, for example sixteen connectors, and a heat sink such as presented previously fastened to the at least one electronic board so that each connector interfaces with one of the interfacing zones of said heat sink.

In at least one embodiment, the connectors are of transceiver type.

According to at least one embodiment of the invention, the connectors are active connectors, i.e. the connectors are configured to receive and transmit data on the one hand on a wired communication link and on the other hand on a wireless communication link.

According to at least one embodiment of the invention, the connectors are pluggable and configured to each be connected to an electronic board of the compute blade via a communication cable.

Preferably, by way of one or more embodiments, the connectors are of the OSFP type.

At least one embodiment of the invention also relates to a method for manufacturing a liquid-cooled heat sink for a plurality of compute blade connectors, the method including:

creating, preferably by machining, an elongated shaped body defining on one of its faces a heat collection surface of the plurality of connectors, the body including a refrigerant liquid inlet port and a refrigerant liquid outlet port and being configured to convey the refrigerant liquid through a cooling circuit between the inlet port and the outlet port, the heat collection surface comprising a plurality of interfacing zones arranged consecutively along the heat collection surface, each interfacing zone being configured to interface with a connector of the plurality of connectors in order to collect heat to transfer it to the cooling circuit, creation, preferably by machining, of at least one stiffener configured to be mounted on the body, mounting of the at least one stiffener at least partially along the body.

In at least one embodiment, the stiffener is mounted at least along a portion of the interfacing zones.

Advantageously, by way of one or more embodiments, the at least one stiffener is mounted at least over the entire length of the interfacing zones.

Further advantageously, by way of one or more embodiments, the stiffener is mounted at least over the entire length of the heat collection surface.

Preferably, by way of one or more embodiments, the at least one stiffener has a U shape and is mounted along a longitudinal edge and the two lateral edges of the body.

Advantageously, by way of one or more embodiments, the stiffener is made of metal, preferably steel.

In at least one embodiment, the interfacing zones have a rectangular shape.

Advantageously, by way of one or more embodiments, the interfacing zones are delimited by an edge of the body.

Further advantageously, by way of one or more embodiments, the heat collection surface comprises at least eight interfacing zones, preferably sixteen interfacing zones to interface with sixteen connectors arranged side by side.

In at least one embodiment, each connector is configured to be connected to an electronic board of the compute blade via a communication cable.

According to at least one embodiment of the invention, the connectors are active connectors, i.e. the connectors are configured to receive and/or transmit data.

In at least one embodiment, the connectors are of the transceiver type, preferably of the OSFP type.

In at least one embodiment, the inlet port is located at a first end of the body and the outlet port is located at a second end, opposite the first end.

Preferably, by way of one or more embodiments, the body comprises a single inlet port and a single outlet port.

Advantageously, by way of one or more embodiments, the body has a substantially rectangular global shape.

Preferably, by way of one or more embodiments, the ratio of the length of the body over the width of the body is greater than two, preferably four.

According to at least one embodiment of the invention, the body is made of metal, preferably aluminium, more preferably made of series 6063 aluminium.

BRIEF DESCRIPTION OF THE DRAWINGS

Further characteristics and advantages of the one or more embodiments of the invention will further appear upon reading the description that follows. This is purely illustrative and should be read in conjunction with the appended drawings in which.

DETAILED DESCRIPTION OF THE INVENTION

Figure 2:
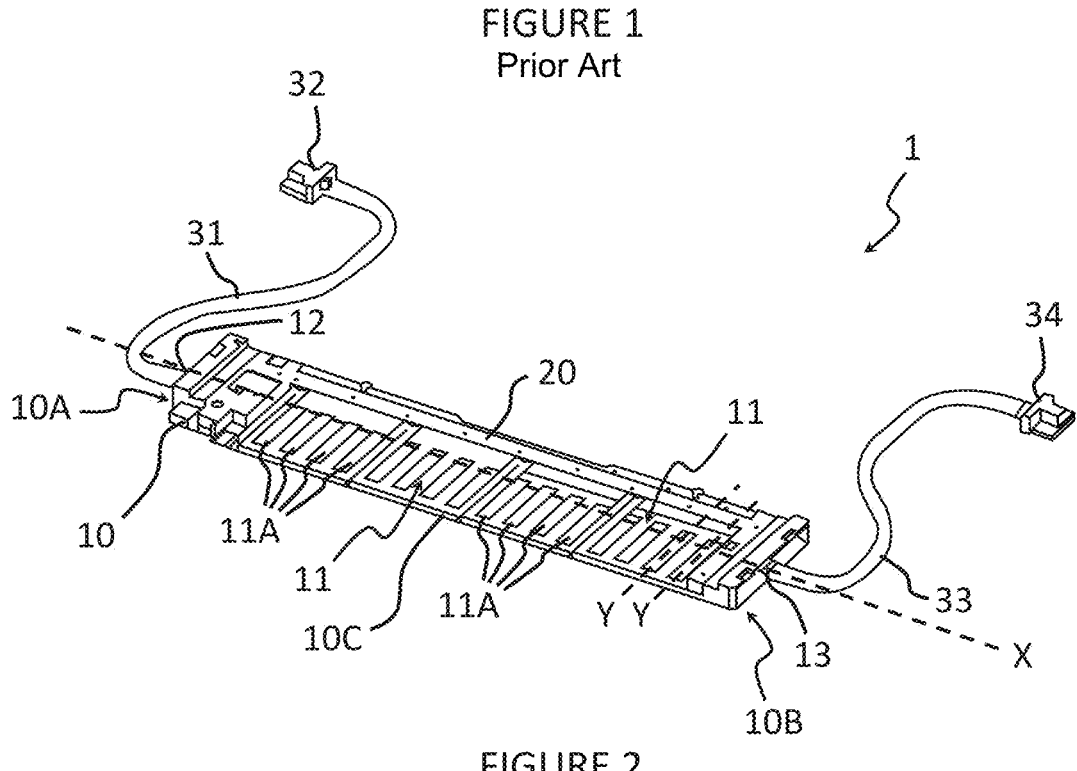
FIG. 2 schematically shows a heat sink according to one or more embodiments of the invention.

FIG. 2 shows an example of a liquid-cooled heat sink 1 according to one or more embodiments of the invention.

The heat sink 1 is intended to be mounted in a supercomputer compute blade in order to collect the heat generated by active connectors of the compute blade. More precisely, according to one or more embodiments of the invention, the heat sink 1 is intended to be fastened to a compute blade electronic board via fasteners by interfacing with the active connectors.

The connectors have not been shown in the figures but are interfaced with the heat sink 1. The term "to interface" is understood to mean that the heat sink is placed against the connectors to collect the heat generated by said connectors.

A small space may be provided between the heat sink 1 and the connectors, for example less than 5 mm, but the heat sink 1 is preferably mounted in physical contact with the connectors to better absorb the heat generated by said connectors. A thermal bridge type dissipative interface may also ensure contact between the heat sink 1 and the connectors.

Heat Sink 1

According to one or more embodiments of the invention, the heat sink 1 comprises a body 10 and at least one stiffener 20. In the example shown in FIGS. 2 to 4, in at least one embodiment, the heat sink 1 comprises a body 10 and a single stiffener 20 in order to simplify the manufacture and the assembly of the heat sink 1. In at least one embodiment, the heat sink 1 could comprise a body 10 and several stiffeners, of identical or different shapes.

Body 10

The body 10 has an elongated, substantially rectangular shape, extending along a longitudinal axis X. In the example shown in FIGS. 2 to 4, by way of at least one embodiment, the ratio of the length of the body 10 over the width of the body 10 is greater than four to allow cooling of sixteen connectors while maintaining a body 10 width slightly greater than the length of the connectors, i.e. relatively narrow to improve the lateral compactness of the heat sink 1. The body 10 is made of metal, preferably aluminium, more preferably series 6063 aluminium, which is a type of aluminium that is inexpensive, easy to machine and notably strong. In addition, this type of aluminium allows maximizing the service life by these corrosion resistance properties.

The body 10 defines on one of its faces a surface 11 called "heat collection" intended to interface with the connectors to collect at least part of the heat that said connectors generate.

Figure 3:
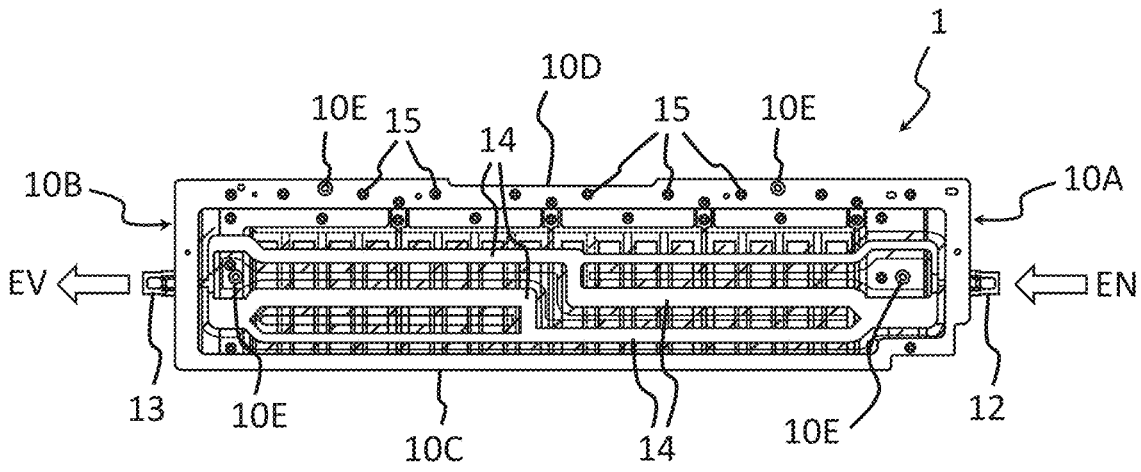
FIG. 3 is a bottom view of the heat sink of FIG. 2, i.e. the face opposite the heat collection surface, the body being shown transparently, according to one or more embodiments of the invention.

In reference to FIG. 3, in at least one embodiment, the body 10 comprises an inlet port 12, an outlet port 13, and a cooling circuit 14 running under the heat collection surface 11 between said inlet port 12 and said outlet port 13.

The inlet port 12 is located at a first end 10A of the body 10 and the outlet port 13 is located at a second end 10B of the body 10, opposite the first end 10A.

Still in reference to FIG. 3, by way of one or more embodiments, the inlet port 12 allows for the inlet EN of refrigerant liquid (not visible) into the cooling circuit 14. As shown in FIG. 2, in at least one embodiment, the inlet port 12 is supplied with refrigerant liquid by a cooling module (not shown in the figures) via an inlet pipe 31 and an inlet hydraulic block 32.

In reference to FIGS. 2 and 3, in at least one embodiment, the outlet port 13 allows the evacuation EV of the refrigerant liquid from the body 10 to the refrigeration module in order to regenerate it via an outlet pipe 33 and an outlet hydraulic block 34.

The cooling circuit 14 runs through the body 10 under the heat collection surface 11 so as to cover a substantial area of said surface 11 and thus collect a substantial amount of the heat generated by the connectors.

The heat collection surface 11 has a rectangular shape extending in a direction parallel to the longitudinal axis X.

The surface 11 comprises a plurality of distinct zones known as "interfacing" 11A.

In reference to FIG. 2, in at least one embodiment, the interfacing zones 11A have a rectangular shape and are arranged consecutively along said heat collection surface 11, i.e. between its two ends, the longitudinal axis Y of each interfacing zone 11A extends orthogonally to the longitudinal axis of the heat collection surface, i.e. orthogonally to the longitudinal axis X of the body. In FIG. 2, in at least one embodiment, only two longitudinal axes Y have been shown for clarity.

Each interfacing zone 11A is configured to interface with a connector of the plurality of connectors to collect part of the heat to transfer it to the cooling circuit 14.

Figure 4:
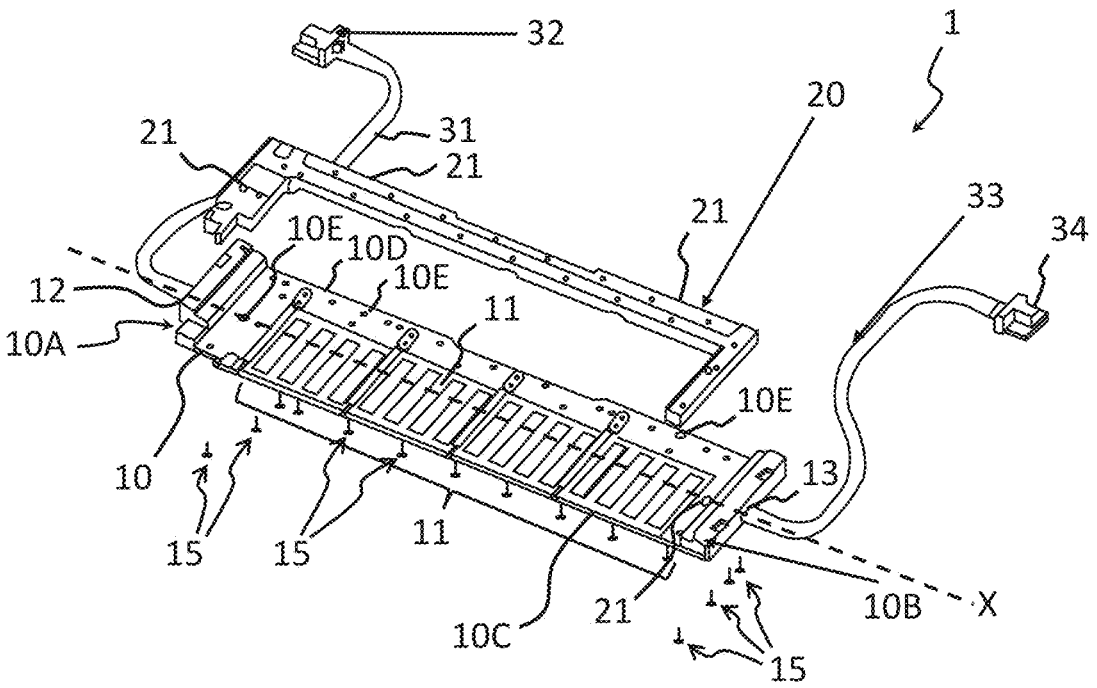
FIG. 4 is an exploded view of the heat sink in FIG. 2 showing in particular the body and the stiffener, according to one or more embodiments of the invention.

In the example of FIGS. 2 to 4, by way of one or more embodiments, the heat collection surface 11 comprises sixteen interfacing zones 11A, allowing the heat sink 1 to cool sixteen connectors simultaneously. In this example, by way of one or more embodiments, but in a non-limiting manner, the interfacing zones 11A are delimited by an edge 100 of the body 10 in order to optimize the width of said body 10, the opposite edge 10D of the body 10 (visible in FIG. 3) receiving the stiffener 20.

In this example, by way of one or more embodiments, the body 10 comprises four holes 10E for receiving screws fastening the heat sink 1 to an electronic board of a compute blade.

Stiffener 20

The stiffener 20, by way of one or more embodiments, is mounted on the body 10 to reinforce it to prevent it from deforming.

In the example shown in FIGS. 2 to 4, by way of one or more embodiments, the stiffener 20 substantially has a U shape by extending along both a longitudinal 10D edge of the body 10, over more than four-fifths of the length of said body 10 in this example for effective reinforcement, and over the entire width of the body 10 at both the first end 10A and the second end 10B of the body 10.

The stiffener 20 may advantageously be made of metal, preferably steel.

The stiffener 20 is mounted on the body 10 by means of a plurality of screws 15 (FIGS. 3 and 4).

In this example, by way of one or more embodiments, the stiffener 20 further comprises four holes 21, superimposed with the holes 10E of the body 10, making it possible to receive screws fastening the heat sink 1 to an electronic board of a compute blade.

Connectors

In at least one embodiment, the connectors are active of the transceiver type, i.e., the connectors are configured to receive and transmit signals comprising data.

In the example of FIGS. 2 to 4, by way of one or more embodiments, the interfacing zones 11A are adapted to receive OSFP type connectors.

The connectors are pluggable and configured to each be connected to a compute blade circuit board via a communication cable.

The connectors are also configured to communicate with an external communication network (not shown) over a wireless communication link.

It goes without saying that in at least one embodiment, the heat sink 1 could be adapted to receive other types of connectors, as long as it emits a quantity of heat to be discharged.

Example of Manufacture

Figure 5:
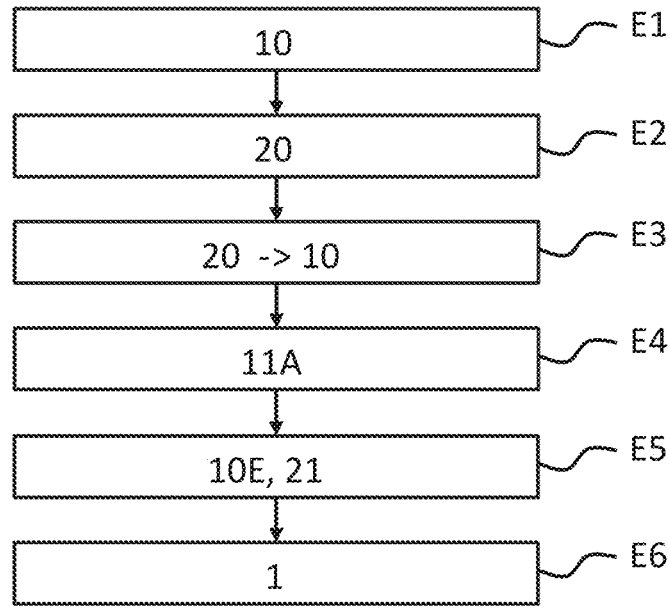
FIG. 5 schematically shows a method of manufacturing according to one or more embodiments of the invention.

In reference to FIG. 5, by way of one or more embodiments, in a step E1, the body 10 is first formed, preferably by machining, preferably in series 6063 aluminium, so as to in particular form the heat collection surface 11, the inlet port 12, the outlet port 13 and the cooling circuit 14.

In parallel, in a step E2, the stiffener 20 is formed, preferably by machining in steel, by way of one or more embodiments.

Then, in a step E3, in reference to FIG. 4, by way of one or more embodiments, the U-shaped stiffener is mounted on the body 10 with screws 15 so as to surround the heat collection surface 11 on three sides and thus stiffen the body 10 so as to support the interfacing of sixteen connectors with the interfacing zones 11A.

In a step E4, by way of one or more embodiments, the heat sink 1 may be placed so that the interfacing zones 11A cover the connectors of a compute blade (not shown) and then fastened in a step E5 on one of the electronic boards of the compute blade using fasteners, preferably four or less fasteners. These fasteners may be screws fastened through the dedicated holes 10E and 21 formed respectively in the body 10 and in the stiffener 20, as shown in FIGS. 3 and 4.

Figure 6:
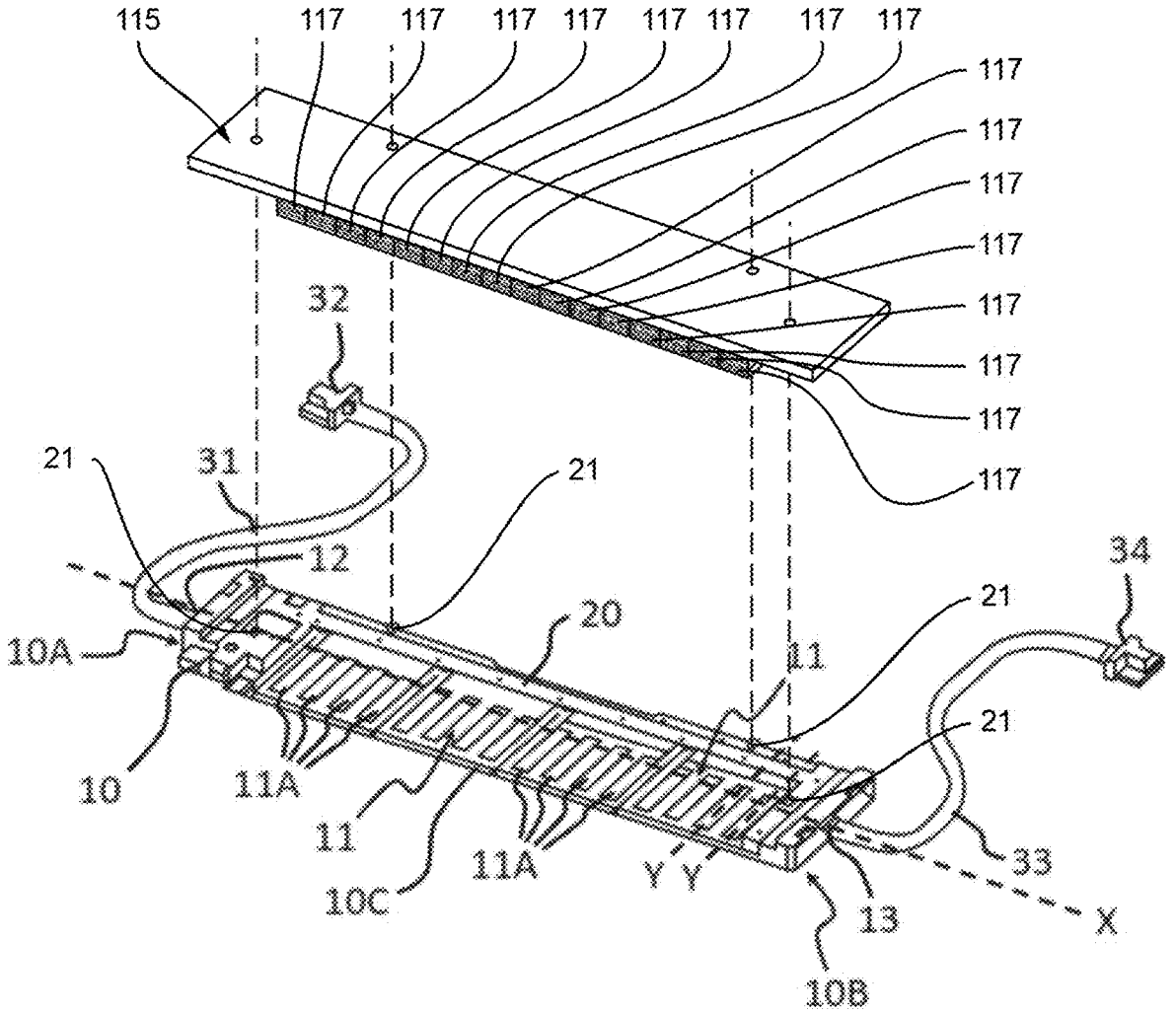
FIG. 6 is a variant of FIG. 4, as an exploded view of the heat sink in FIG. 4 showing the body and the stiffener and the interaction between the heat sink and connectors, according to one or more embodiments of the invention.

In a step E6, by way of one or more embodiments, the compute blade may be placed in a supercomputer and the heat sink 1 connected to a refrigeration module configured to supply it with refrigerant liquid and thus allow the connectors to be cooled. FIG. 6 is a variant of FIG. 4, as an exploded view of the heat sink in FIG. 4 showing the body and the stiffener and the interaction between the heat sink and the connectors, according to one or more embodiments of the invention. For example, FIG. 6 shown an outline of a connector of the plurality of compute blade connectors, wherein each interfacing zone of said plurality of interfacing zones 11A is configured to interface with a connector of the plurality of compute blade connectors in order to collect heat to transfer it to the cooling circuit 14. As shown in FIG. 6, for example, the heat sink 1 is fastened to the at least one electronic board such that each connector of the plurality of connectors interfaces with one interfacing zone of the plurality of interfacing zones of the heat sink 1, in order to collect the heat to transfer the heat to the cooling circuit 14. In at least one embodiment, the stiffener 20 includes four holes 21, superimposed with the holes 10E of the body 10, to receive screws fastening the heat sink 1 to the electronic board of the compute blade. A shown, for example, the heat collection surface 11 comprises sixteen interfacing zones 11A, allowing the heat sink 1 to cool sixteen connectors simultaneously. As shown, for example, electronic board 115 comprises sixteen connectors 117 on its bottom side and the heat sink 1 right before being mounted on the bottom side. As also shown in FIG. 2 and previously discussed, a small space may be provided between the heat sink 1 and the connectors, wherein the heat sink 1 is preferably mounted in physical contact with the connectors to better absorb the heat generated by the connectors. In contrast, the electronic board

Figure 1:
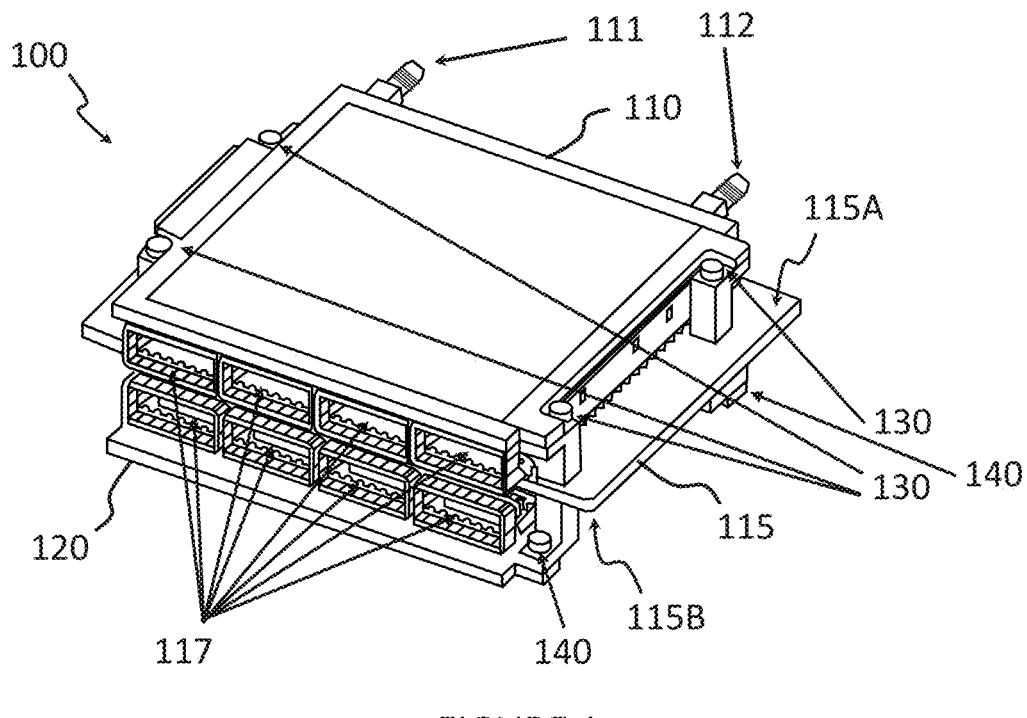
FIG. 1 schematically shows a system of a heat sink of the prior art.

115 shown in FIG. 1 comprises four connectors on its bottom side and four connectors on its top side.

At least one embodiment of the invention thus has the advantage of being able to interface a single heat sink with more than four or five connectors, in particular with sixteen connectors, while maintaining significant compactness, efficiency and robustness.

The invention claimed is:

1. A liquid-cooled heat sink for a plurality of compute blade connectors, said liquid-cooled heat sink comprising:
   an elongated shaped body defining, on one outer face of a plurality of outer faces of said elongated shaped body, a heat collection surface, and
   at least one stiffener mounted on said outer face of the elongated shaped body, the elongated shaped body being made of aluminum, and the at least one stiffener being made of steel,
      wherein said elongated shaped body comprises an inlet port of a cooling liquid and an outlet port of the cooling liquid, and wherein said elongated shaped body is configured to convey the cooling liquid through a cooling circuit between said inlet port and said outlet port,
      wherein said heat collection surface comprises a plurality of interfacing zones arranged consecutively along the heat collection surface, and
      wherein each interfacing zone of said plurality of interfacing zones is configured to interface with one connector of the plurality of compute blade connectors in order to collect heat to transfer the heat to the cooling circuit.

2. The liquid-cooled heat sink according to claim 1, wherein the at least one stiffener is arranged at least along a portion of the plurality of interfacing zones.

3. The liquid-cooled heat sink according to claim 1, wherein the at least one stiffener is arranged at least along an entire length of the plurality of interfacing zones.

4. The liquid-cooled heat sink according to claim 1, wherein the at least one stiffener is arranged at least over an entire length of the heat collection surface.

5. The liquid-cooled heat sink according to claim 1, wherein the at least one stiffener has a U shape extending along a longitudinal edge and two lateral edges of the elongated shaped body.

6. The liquid-cooled heat sink according to claim 1, wherein the plurality of interfacing zones are delimited by an edge of the elongated shaped body.

7. The liquid-cooled heat sink according to claim 1, wherein the plurality of interfacing zones comprise at least eight interfacing zones.

8. The liquid-cooled heat sink according to claim 1, wherein the inlet port is located at a first end of the elongated shaped body and the outlet port is located at a second end of the elongated shaped body, opposite the first end.

9. The liquid-cooled heat sink according to claim 1, wherein the elongated shaped body has a substantially rectangular overall shape.

10. The liquid-cooled heat sink according to claim 1, wherein a ratio of a length of the elongated shaped body over a width of the elongated shaped body is greater than two.

11. A supercomputer compute blade comprising:
   at least one electronic board comprising at least one processor, a plurality of connectors, and a heat sink,
   wherein said heat sink comprises
      an elongated shaped body defining, on one outer face of a plurality of outer faces of said elongated shaped body, a heat collection surface, and at least one stiffener mounted on said outer face of the elongated shaped body, the elongated shaped body being made of aluminum, and the at least one stiffener being made of steel, wherein said elongated shaped body comprises an inlet port of a cooling liquid and an outlet port of the cooling liquid, and wherein said elongated shaped body is configured to convey the cooling liquid through a cooling circuit between said inlet port and said outlet port, wherein said heat collection surface comprises a plurality of interfacing zones arranged consecutively along the heat collection surface, and wherein said heat sink is fastened to the at least one electronic board such that each connector of said plurality of connectors interfaces with one interfacing zone of the plurality of interfacing zones of said heat sink, in order to collect heat to transfer the heat to the cooling circuit.

12. The supercomputer compute blade of claim 11, wherein the plurality of connectors are OSFP type connectors.

13. A method for manufacturing a liquid-cooled heat sink for a plurality of compute blade connectors, said method comprising:

creating an elongated shaped body defining, on one outer face of a plurality of outer faces of said elongated shaped body, a heat collection surface, the elongated shaped body being made of aluminum, wherein said elongated shaped body comprises an inlet port for a cooling liquid and an outlet port for said cooling liquid, wherein said elongated shaped body is configured to convey the cooling liquid through a cooling circuit between said inlet port and said outlet port, wherein said heat collection surface comprises a plurality of interfacing zones arranged consecutively along the heat collection surface, wherein each interfacing zone of said plurality of interfacing zones is configured to interface with one connector of the plurality of compute blade connectors in order to collect heat to transfer the heat to the cooling circuit, creating at least one stiffener configured to be mounted on said outer face of the elongated shaped body, the at least one stiffener being made of steel, mounting the at least one stiffener at least partially along said outer face of the elongated shaped body.

* * * * *